United States Patent
Lee et al.

(10) Patent No.: US 12,317,410 B2
(45) Date of Patent: *May 27, 2025

(54) ACCESS POINT DEVICE

(71) Applicant: Google LLC, Mountain View, CA (US)

(72) Inventors: Yau-Shing Lee, Sunnyvale, CA (US); Rolando Willcox Esparza, San Francisco, CA (US); George Liu, Taipei (TW); Wing Tung Wong, Sunnyvale, CA (US); Frédéric Heckmann, Taipei (TW); Vivian W. Tang, Mountain View, CA (US)

(73) Assignee: Google LLC, Mountain View, CA (US)

( * ) Notice: Subject to any disclaimer, the term of this patent is extended or adjusted under 35 U.S.C. 154(b) by 201 days.

This patent is subject to a terminal disclaimer.

(21) Appl. No.: 18/331,627

(22) Filed: Jun. 8, 2023

(65) Prior Publication Data

US 2023/0319979 A1 Oct. 5, 2023

Related U.S. Application Data

(63) Continuation of application No. 17/520,545, filed on Nov. 5, 2021, now Pat. No. 11,744,007, which is a
(Continued)

(51) Int. Cl.
*H05K 1/02* (2006.01)
*H05K 7/14* (2006.01)
(Continued)

(52) U.S. Cl.
CPC ........... *H05K 1/023* (2013.01); *H05K 1/0203* (2013.01); *H05K 7/1417* (2013.01);
(Continued)

(58) Field of Classification Search
CPC ............................. H04W 88/08; H01Q 5/307
See application file for complete search history.

(56) References Cited

U.S. PATENT DOCUMENTS

| 7,609,217 B2 | 10/2009 | Noro et al. |
| 8,994,276 B2 | 3/2015 | Recker et al. |

(Continued)

FOREIGN PATENT DOCUMENTS

| CH | 202841408 | * | 3/2013 | ............ H04N 21/41 |
| CN | 202841408 | | 3/2013 | |

(Continued)

OTHER PUBLICATIONS

CN_108650185_A_I, English translation (Year: 2018).*
(Continued)

*Primary Examiner* — Mukundbhai G Patel
(74) *Attorney, Agent, or Firm* — Colby Nipper PLLC

(57) ABSTRACT

This document describes an access point device and associated systems and methods. The techniques and systems include an access point device that includes a housing with an antenna carrier, a circuit board assembly, a heat sink, and a heat shield positioned within the housing. The housing includes a top housing member connected to a bottom housing member. The top housing member includes a concave-down top-end portion connected to a generally cylindrical vertical wall via rounded corners. The antenna carrier supports multiple antennas positioned proximate to an inner surface of the vertical wall. The heat sink is positioned between the antenna carrier and the circuit board assembly. The circuit board assembly is positioned between the heat shield and the heat sink, and the heat shield is positioned between the circuit board assembly and the bottom housing member.

20 Claims, 13 Drawing Sheets

Related U.S. Application Data continuation of application No. 17/001,563, filed on Aug. 24, 2020, now Pat. No. 11,202,341, which is a continuation of application No. PCT/US2019/053162, filed on Sep. 26, 2019.

(51) Int. Cl.
- *H05K 7/20* (2006.01)
- *H01Q 5/307* (2015.01)
- *H04W 88/08* (2009.01)
- *H04W 88/16* (2009.01)

(52) U.S. Cl.
CPC ........... *H05K 7/2039* (2013.01); *H01Q 5/307* (2015.01); *H04W 88/08* (2013.01); *H04W 88/16* (2013.01); *H05K 2201/10098* (2013.01); *H05K 2201/10106* (2013.01)

(56) References Cited

U.S. PATENT DOCUMENTS

| | | |
|---|---|---|
| 9,439,333 B2 | 9/2016 | Daughtry et al. |
| 9,979,078 B2 | 5/2018 | Koskiniemi |
| 10,290,302 B2 | 5/2019 | Heckmann et al. |
| 10,448,538 B1 | 10/2019 | Gaul et al. |
| 11,202,341 B2 | 12/2021 | Lee et al. |
| 11,744,007 B2 | 8/2023 | Lee et al. |
| 2016/0329641 A1 | 11/2016 | Lee et al. |
| 2019/0020713 A1 | 1/2019 | Hulick et al. |
| 2019/0089872 A1 | 3/2019 | Rukes et al. |
| 2019/0267700 A1 | 8/2019 | Hendrix et al. |
| 2019/0268177 A1 | 8/2019 | Li |
| 2019/0372203 A1* | 12/2019 | Su .................. H01Q 1/246 |
| 2021/0100065 A1 | 4/2021 | Lee et al. |
| 2022/0061128 A1 | 2/2022 | Lee et al. |

FOREIGN PATENT DOCUMENTS

| | | | |
|---|---|---|---|
| CN | 202917625 | | 5/2013 |
| CN | 103297345 A | | 9/2013 |
| CN | 103369730 A | | 10/2013 |
| CN | 108650185 | * | 10/2018 ............... H04Q 1/02 |
| CN | 213280114 U | | 5/2021 |
| EP | 3703266 | | 9/2020 |
| JP | 2002164808 | | 6/2002 |
| JP | 2003500966 | | 1/2003 |
| JP | 2016509428 | | 3/2016 |
| JP | 2019503118 | | 1/2019 |
| JP | 6477373 | | 3/2019 |
| JP | 2019050555 | | 3/2019 |
| JP | 2019507519 | | 3/2019 |
| KR | 20190060074 | | 6/2019 |
| TW | M361830 | | 7/2009 |
| TW | 201346180 A | | 11/2013 |
| TW | M520229 | | 4/2016 |
| TW | 201834310 | | 9/2018 |
| WO | 2006036616 | | 4/2006 |
| WO | 2006096852 | | 9/2006 |
| WO | 2016057752 | | 4/2016 |
| WO | 2017068837 A1 | | 4/2017 |
| WO | 2018217268 | | 11/2018 |
| WO | 2018237398 | | 12/2018 |
| WO | 2019095691 | | 5/2019 |
| WO | 2021061127 | | 4/2021 |

OTHER PUBLICATIONS

CN_202841408_U_I, English translation (Year: 2013).*
"Foreign Office Action", TW Application No. 112129666, Apr. 8, 2024, 13 pages.
"Foreign Office Action", CN Application No. 202010979859.7, Apr. 29, 2024, 13 pages.
"Foreign Office Action", TW Application No. 112129666, Sep. 2, 2024, 12 pages.
"Foreign Notice of Allowance", KR Application No. 10-2023-7019748, Feb. 20, 2024, 5 pages.
"Extended European Search Report", EP Application No. 22177278.3, Oct. 13, 2022, 7 pages.
"Foreign Office Action", CN Application No. 202022047620.4, Jan. 8, 2021, 3 pages.
"Foreign Office Action", TW Application No. 110142355, Jan. 10, 2023, 11 pages.
"Foreign Office Action", AU Application No. 2021266199, Jan. 18, 2023, 3 pages.
"Foreign Office Action", CA Application No. 3093914, Mar. 21, 2023, 3 pages.
"Foreign Office Action", JP Application No. 2022-65068, Apr. 25, 2023, 6 pages.
"Foreign Office Action", KR Application No. 10-2022-7024152, Aug. 25, 2022, 11 pages.
"Foreign Office Action", JP Application No. 2020-158739, Oct. 5, 2021, 5 pages.
"Foreign Office Action", EP Application No. 19783937.6, Oct. 20, 2021, 8 pages.
"Foreign Office Action", CA Application No. 3093914, Oct. 21, 2021, 3 pages.
"Foreign Office Action", AU Application No. 2021266199, Oct. 26, 2022, 3 pages.
"Foreign Office Action", IN Application No. 202044039408, Nov. 30, 2021, 6 pages.
"Foreign Office Action", KR Application No. 10-2020-7027619, Dec. 15, 2021, 9 pages.
"Foreign Office Action", AU Application No. 2020220144, Mar. 26, 2021, 8 pages.
"International Preliminary Report on Patentability", Application No. PCT/US2019/053162, Mar. 15, 2022, 8 pages.
"International Search Report and Written Opinion", Application No. PCT/US2019/053162, Jun. 25, 2020, 13 pages.
"Non-Final Office Action", U.S. Appl. No. 17/520,545, Jan. 11, 2023, 14 pages.
"Notice of Allowance", U.S. Appl. No. 17/520,545, Apr. 27, 2023, 8 pages.
"Notice of Allowance", U.S. Appl. No. 17/001,563, Sep. 14, 2021, 8 pages.
"Search Report", TW Application No. 109129994, Aug. 11, 2021, 1 page.

* cited by examiner

ACCESS POINT DEVICE

RELATED APPLICATIONS

This application is a continuation of U.S. patent application Ser. No. 17/520,545, filed Nov. 5, 2021, which is a continuation of U.S. patent application Ser. No. 17/001,563, filed on Aug. 24, 2020, now U.S. Pat. No. 11,202,341, issued Dec. 14, 2021, which is a continuation of International Application No. PCT/US2019/053162, filed Sep. 26, 2019, the disclosures of which are incorporated in their entireties by reference herein.

BACKGROUND

Network access point devices can be large and visually unappealing due to hardware constraints. Some of these devices include external antennas that, based on the device's location within a user's home, are within reach of small children or animals that may move or damage the antennas. Access point devices can include complex controls and status lights that can be difficult for some users to understand. These aspects of conventional access point devices can frustrate users and significantly diminish the user experience.

SUMMARY

This document describes an access point device and associated systems and methods. The access point device described herein includes a housing that is substantially cylindrical with smooth, rounded edges. The described access point device has improved robustness, simplicity, and compactness in comparison to conventional access point devices. As further described herein, the access point device includes a housing with an antenna carrier, a circuit board assembly, a heat sink, and a heat shield positioned within the housing. The housing includes a top housing member connected to a bottom housing member. The top housing member includes a concave-down top-end portion connected to a generally cylindrical vertical wall via rounded corners. The antenna carrier supports multiple antennas positioned proximate to an inner surface of the vertical wall. The heat sink is positioned between the antenna carrier and the circuit board assembly. The circuit board assembly is positioned between the heat shield and the heat sink.

This summary is provided to introduce simplified concepts of an access point device, which is further described below in the Detailed Description and Drawings. This summary is not intended to identify essential features of the claimed subject matter, nor is it intended for use in determining the scope of the claimed subject matter.

BRIEF DESCRIPTION OF THE DRAWINGS

The details of one or more aspects of an access point device are described in this document with reference to the following drawings. The same numbers are used throughout the drawings to reference like features and components.

DETAILED DESCRIPTION

Overview

Figure 1:
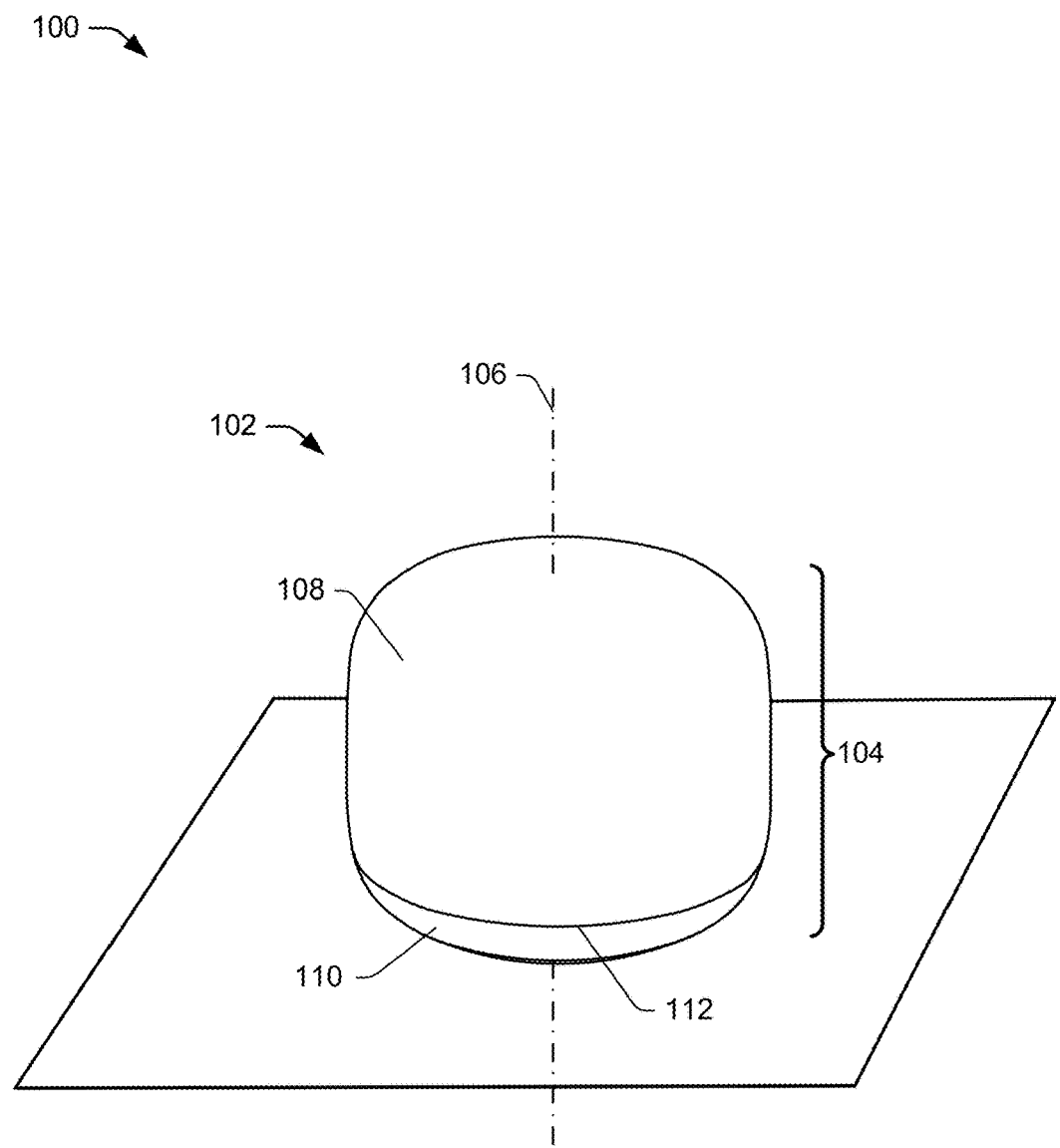
FIG. 1 illustrates a top front perspective view of an example implementation of an access point device.

This document describes techniques and systems that enable an access point device. The access point device described herein has improved robustness, simplicity, and compactness compared to conventional access point devices.

In aspects, an access point device is disclosed. The access point device includes a housing, an antenna carrier, a circuit board assembly, a heat sink, and a heat shield. The housing includes a top housing member having a generally cylindrical vertical wall and a top-end portion connected to a first end of the vertical wall via rounded corners. The vertical wall has a longitudinal axis, an inner surface, and an opposing outer surface. At least a portion of the vertical wall has a non-uniform thickness in a direction of the longitudinal axis based on the outer surface of the vertical wall being curved in the direction of the longitudinal axis and the inner surface of the vertical wall being substantially parallel to the longitudinal axis. Additionally, the top-end portion is concave down in a side view of the top-end portion. The housing also includes a bottom housing member connected to the top housing member at a second end of the vertical wall. The bottom housing member has a bottom exterior surface and an opposing interior surface, wherein the bottom exterior surface defines a plane that is substantially perpendicular to the longitudinal axis of the cylinder. The bottom housing member includes a curved edge between the bottom exterior surface and the vertical wall of the top housing member. The antenna carrier supports multiple antennas operable to transmit and receive communication signals. In aspects, the antenna carrier has a substantially disk-shaped body and a plurality of flanges, with one of the plurality of flanges connected to one of the multiple antennas. The antenna carrier is positioned within the housing such that the multiple antennas are positioned proximate to the inner surface of the vertical wall. The circuit board assembly is positioned within the housing and is operable to provide a gateway to a wireless network. The heat sink is positioned between the antenna carrier and the circuit board assembly within the housing. The heat shield is proximate to the circuit board assembly to shield the circuit board assembly from electromagnetic interference. The circuit board assembly is positioned between the heat shield and the heat sink.

In aspects, a system is disclosed. The system includes a housing having first and second housing members sharing a common central axis and connected to each other. At least one of the first or second housing members includes side walls having a zero-draft inner surface and a partially-curved outer surface. The housing also includes rounded edges. Also, the system includes a plurality of dual-band antennas positioned within the housing proximate to the zero-draft inner surface of the side walls. Also, the system includes a circuit board assembly communicatively connected to the plurality of dual-band antennas to provide a gateway to a wireless network and a node to a wireless mesh network. Additionally, the system includes a heat sink positioned between the circuit board assembly and the plurality of antennas.

These are but a few examples of how the described techniques and devices may be used to enable an access point device. Other examples and implementations are described throughout this document. The document now turns to an example device, after which example systems are described.

Example Device

FIG. 1 illustrates a top front perspective view 100 of an example implementation of an access point device 102. The access point device 102 includes a housing 104 that has a substantially cylindrical shape with rounded edges. The housing 104 includes a central axis 106 (e.g., longitudinal axis). The housing 104 is simple, such that the housing 104 has a smooth exterior surface with few visible features. In aspects, the housing 104 includes a top housing member 108 and a bottom housing member 110.

As is further described below, the housing includes a seam 112 on an outer surface of the housing 104. The seam 112 is aligned with a location at which the top housing member 108 attaches to the bottom housing member 110. The top housing member 108 may be connected (e.g., threaded, snapped, fastened, pressed, glued, ultrasonic welded, etc.) to the bottom housing member 110.

The access point device is configured to provide access to a wireless network. In some aspects, the access point device can also serve as a node to a wireless mesh network. For example, the access point device can interface with a modem at a user's home to act as a wireless router for a local wireless network for the user.

Figure 2A:
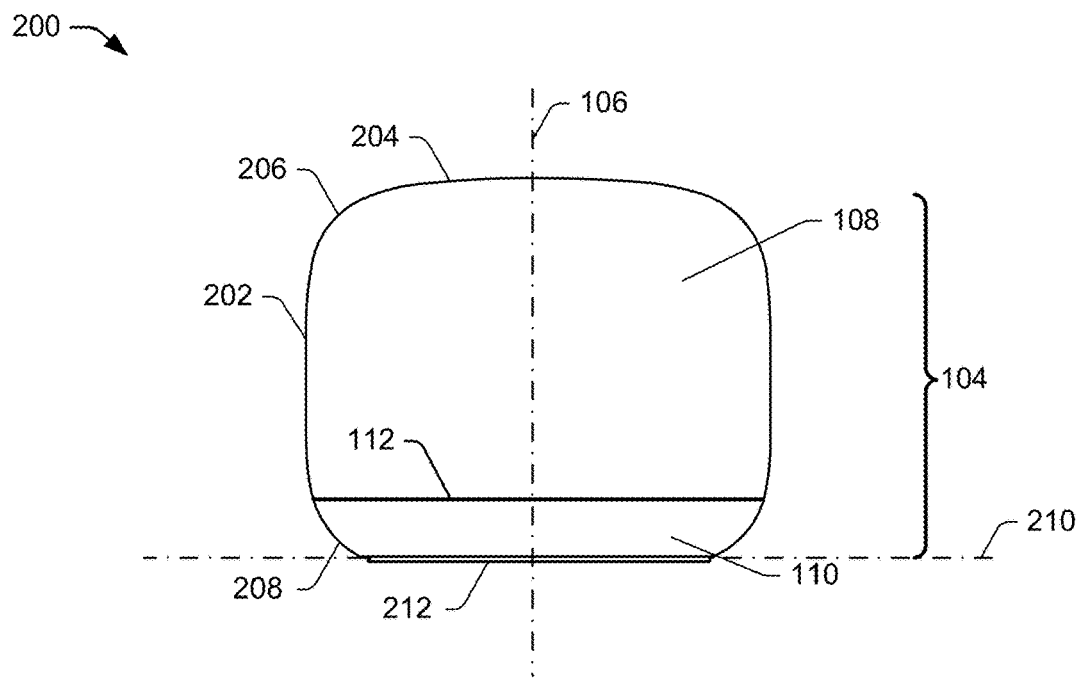
FIG. 2A illustrates a front elevational view of an example implementation of the access point device from FIG. 1.

FIGS. 2A to 2D illustrate various elevational views of the access point device 102. FIG. 2A illustrates a front elevational view 200 of the access point device 102 with the central axis 106 displayed vertically. The top housing member 108 includes a substantially vertical wall 202 that is generally cylindrical about the central axis 106 (e.g., the vertical wall has an x-axis radius substantially equal to a y-axis radius such that the x-axis radius is within an approximately ten millimeter tolerance of the y-axis). Also, the top housing member 108 includes a top-end portion 204 that is concave down in the front elevational view 200 such that the top-end portion 204 curves toward the vertical wall 202. The top-end portion 204 is connected to a first end (e.g., top end) of the vertical wall 202 via rounded edges 206.

The bottom housing member 110 shares the central axis 106 with the top housing member 108 and is connected to the top housing member 108 at a second end (e.g., bottom end) of the vertical wall 202, which is opposite the first end. The bottom housing member 110 includes rounded edges 208 that may have a similar radius to the rounded edges 206 of the top housing member 108. In the illustrated example 200, the bottom housing member 110 is substantially shorter in the direction of the central axis 106 than the top housing member 108, such that the seam 112 is located on the lower half of the housing 104. However, the bottom housing member 110 and the top housing member 108 can be any suitable height such that the seam 112 can be located at any location on the housing where the top housing member 108 is connected to the bottom housing member 110. A radius of the vertical wall 202 about the central axis 106 can be any suitable radius, such as a radius within a range of approximately 38 mm to approximately 65 mm.

The bottom housing member 110 includes a bottom exterior surface (not shown in FIGS. 2A to 2E) that defines a plane 210 that is substantially perpendicular to the central axis 106 (e.g., an angle between the plane 210 and the central axis 106 is within a five degree tolerance of a right angle). Connected to the bottom housing member 110 is a footpad 212 that provides friction. The bottom housing member 110 is positioned between the top housing member 108 and the footpad 212. The footpad 212 can be formed of any suitable material with a sufficiently high friction coefficient to reduce sliding between the housing 104 and a surface upon which the housing 104 is resting. The footpad 212 may be any suitable height, examples of which include a height within a range of approximately 0.5 millimeters to approximately 1.5 millimeters.

Figure 2B:
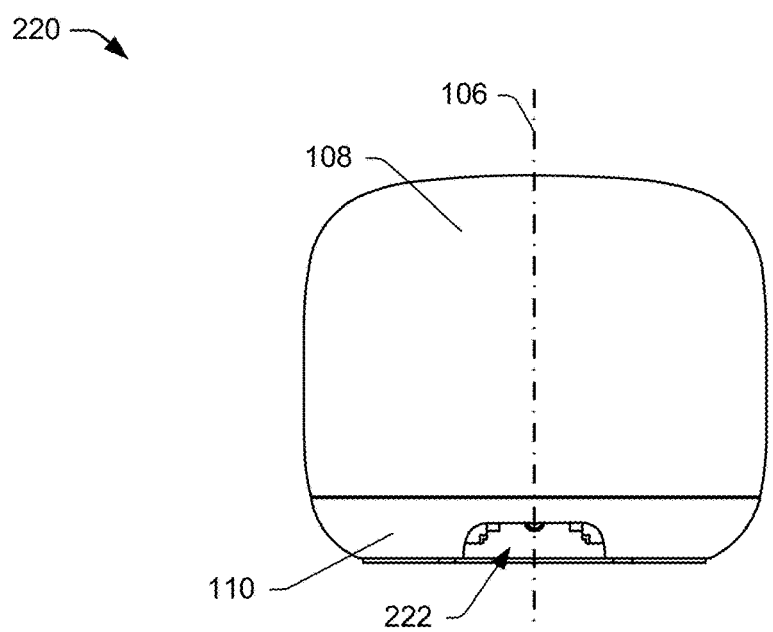
FIG. 2B illustrates a rear elevational view of an example implementation of the access point device from FIG. 1.

FIG. 2B illustrates a rear elevational view 220 of the access point device 102. As illustrated in the rear elevational view 220, the bottom housing member 110 includes an opening 222. The opening provides accessibility for cables (e.g., power cables, Ethernet cables, etc.) to connect to ports underneath the housing without causing the housing 104 to rest on the cables.

Figure 2C:
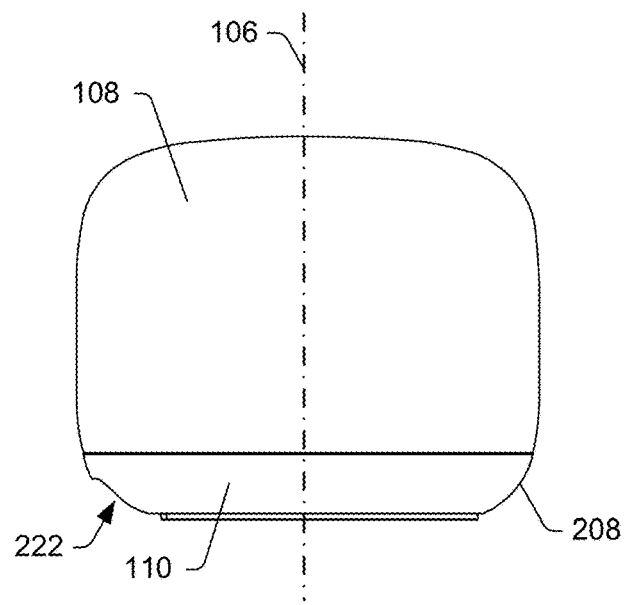
FIG. 2C illustrates a left elevational view of an example implementation of the access point device from FIG. 1.
Figure 2D:
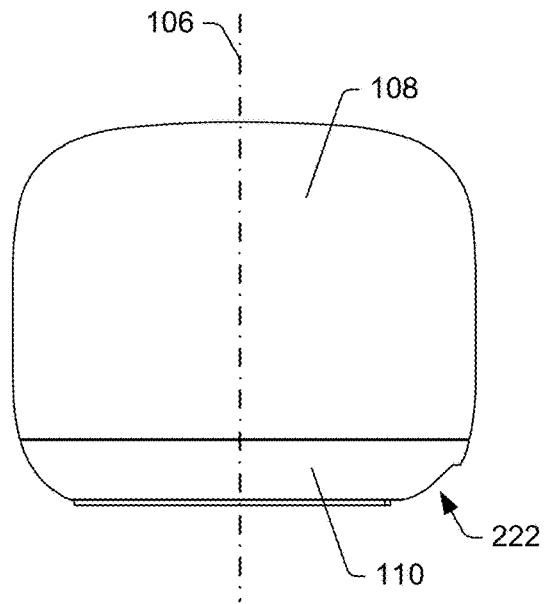
FIG. 2D illustrates a right elevational view of an example implementation of the access point device from FIG. 1.

FIG. 2C illustrates a left elevational view 230 of the access point device 102. As illustrated, a profile of the opening 222 changes a curvature of the rounded edge 208 proximate to the opening 222 relative to the curvature of the rounded edge 208 at other portions. Similarly, FIG. 2D illustrates a right elevational view 240 of the access point device 102. Here, the opening 222 changes the curvature of the rounded edge 208. However, other edges, sides, and exterior surfaces of the housing 104 remain similar in each of the different elevational views 2A to 2D.

Figure 3:
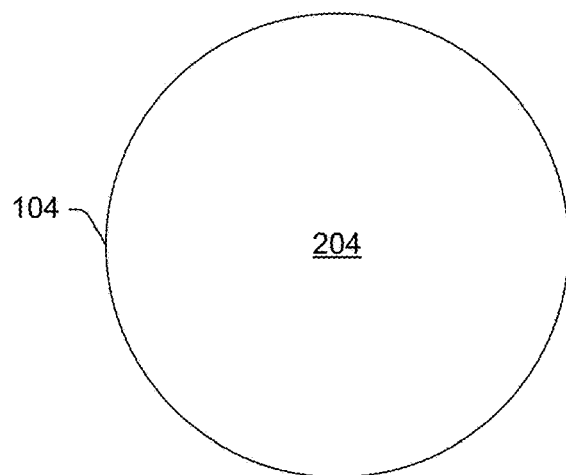
FIG. 3 illustrates a top plan view of an example implementation of the access point device from FIG. 1.

FIG. 3 illustrates a top plan view 300 of the access point device 102. Here, the access point device 102 is generally circular with no distinctive surface features. In the top plan view 300, the top-end portion 204 of the housing 104 is shown.

Figure 4:
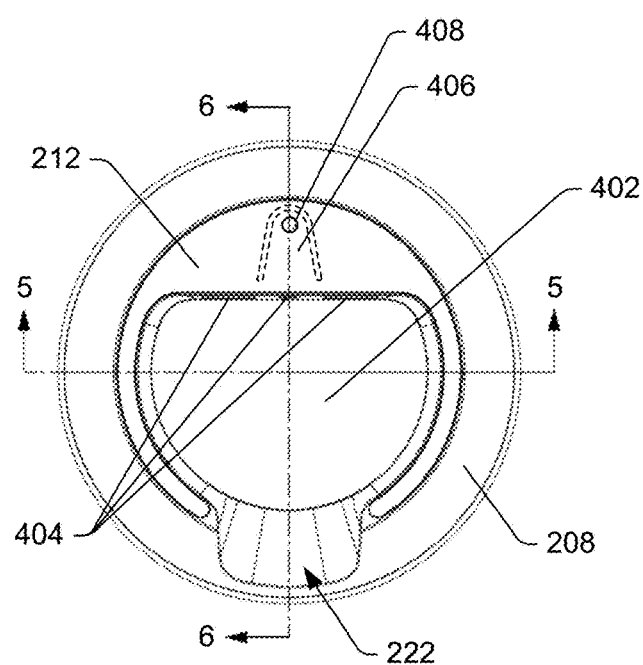
FIG. 4 illustrates a bottom plan view of an example implementation of the access point device from FIG. 1.

FIG. 4 illustrates a bottom plan view 400 of the access point device 102. The bottom housing member 110 includes an exterior cavity 402 formed by a portion of a bottom exterior surface, and the exterior cavity 402 is accessible via the opening 222. As is further described below, the cavity 402 includes openings 404 that align with various ports on a circuit board assembly positioned within the housing. Example ports include Ethernet ports and an electrical power connector. The openings 404 are located in a vertical wall of the cavity 402 that is substantially parallel to the central axis 106 of the housing 104 such that an angle between the central axis 106 and the vertical wall of the cavity 402 is less than approximately five degrees.

The footpad 212 is connected to the bottom exterior surface of the bottom housing member 110. The footpad 212 has a general C-shape such that the footpad 212 partially encircles the cavity 402 to opposing sides of the opening 222.

In addition, the bottom housing member 110 includes a cantilever member 406 formed within the bottom housing member 110 and connected to the bottom housing member 110 at a fulcrum. The cantilever member 406 is illustrated as dotted lines because in this bottom plan view 400, the cantilever member 406 is located behind the footpad 212. Accordingly, the cantilever member 406 may be hidden from view due to the positioning of the footpad 212. The cantilever member 406 is coplanar with the plane 210 defined by the bottom exterior surface of the bottom housing member 110. The cantilever member 406 is bendable, by a force applied to a free end of the cantilever member 406, to interface with a reset mechanism (described below in relation to FIG. 10D) on the circuit board assembly that is positioned within the housing 104. In aspects, the cantilever member 406 acts as a reset button that the user can press to reset the access point device 102. The footpad 212 includes a hole 408 aligned with the free end of the cantilever member 406. The hole 408 in the footpad 212 provides an indication to a user of a location of the reset button. The bottom plan view 400 includes a section line 5-5, which corresponds to the sectional view in FIG. 5, and a section line 6-6, which corresponds to a sectional view in FIG. 6.

Figure 5:
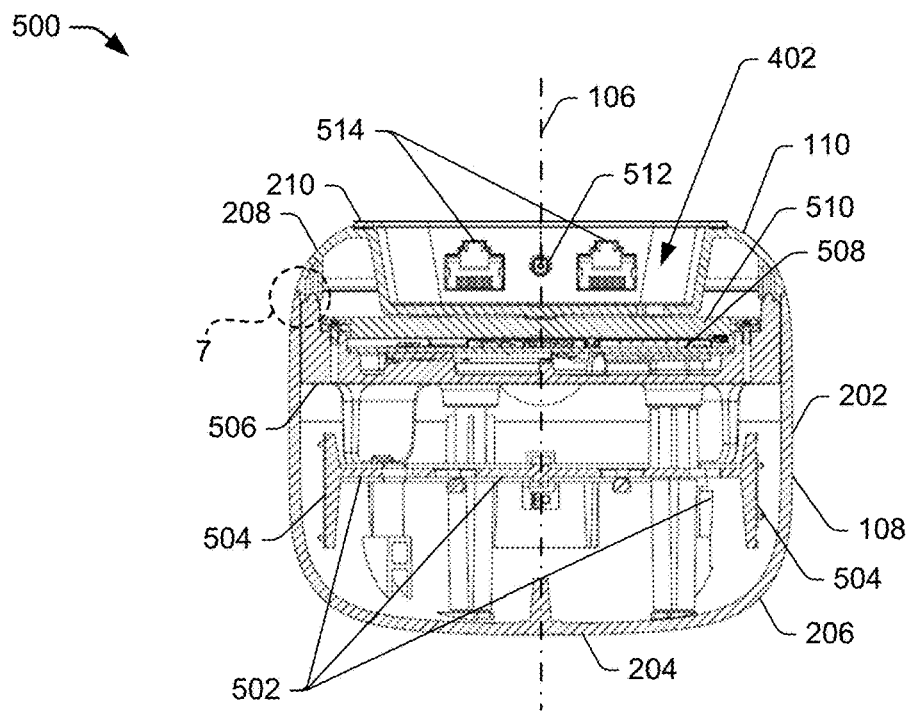
FIG. 5 illustrates a rear sectional view of the access point device of FIG. 4, taken along the section line 5-5.

FIG. 5 illustrates a sectional view 500 of the access point device 102 of FIG. 4 taken at the horizontal sectioning plane and in the direction indicated by section line 5-5. In this sectional view 500, the access point device 102 is upside down such that the top housing member 108 is shown in the lower region of the illustration and the bottom housing member 110 is shown in the upper region of the illustration. The access point device 102 includes various hardware components within the housing 104 in a compact assembly. For example, the access point device 102 includes an antenna carrier 502 supporting multiple antennas 504 attached thereto. The antenna carrier 502 is positioned within the housing 104 proximate (e.g., adjacent) to an inner surface of the top-end portion 204 of the top housing member 108. In addition, each of the antennas 504 is positioned proximate to an inner surface of the vertical wall 202, such that the antennas 504 are located within a tolerance distance of approximately two millimeters of the inner surface of the vertical wall 202.

The access point device also includes a heat sink 506 and a circuit board assembly 508. The heat sink 506 is positioned within the housing 104 proximate (e.g., adjacent) to, and abuts, the antenna carrier 502 such that the heat sink 506 is between the antenna carrier 502 and the circuit board assembly 508. The heat sink 506 may be formed from any suitable heat-conducting material, including die-cast aluminum.

The circuit board assembly 508 may include any suitable circuit board with connected electronic components in any suitable arrangement. One example includes a printed circuit board assembly (PCBA). The circuit board assembly 508 is positioned between the heat sink 506 and a heat shield 510. The heat shield 510 blocks heat transfer between opposing sides of the heat shield 510, e.g., in the direction of the central axis 106. Accordingly, the heat shield 510 shields heat, generated by the circuit board assembly 508, from transferring to the bottom housing member 110 of the access point device 102. This reduces the risk of thermal damage to cables or wires (not shown) that are connected to the access point device 102. In addition, the heat shield 510 is adjacent to the circuit board assembly 508 to shield the circuit board assembly 508 from electromagnetic interference (EMI) from the external wires or cables connected to the access point device 102, such as a power cable connected to an electrical power connector 512 (e.g., barrel jack) or a cable connected to an Ethernet port 514 of the access point device 102. The Ethernet ports 514 and the electrical power connector 512 are accessible via the exterior cavity 402 of the bottom housing member 110. The heat shield 510 is positioned between the circuit board assembly 508 and the bottom housing member 110.

Figure 6:
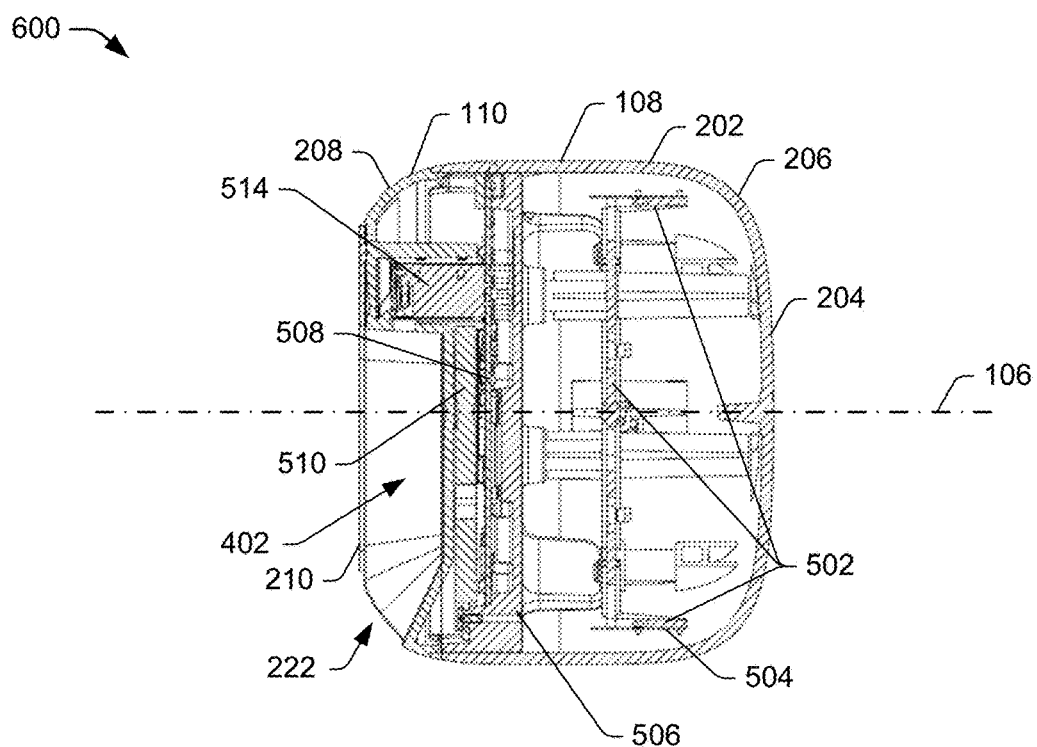
FIG. 6 illustrates a right elevational view of the access point device of FIG. 4, taken along section line 6-6.

FIG. 6 illustrates a sectional view 600 of the access point device 102 of FIG. 4 taken at the vertical sectioning plane and in the direction indicated by section line 6-6. In this sectional view 600, the access point device 102 is illustrated with the central axis 106 being horizontal such that the top housing member 108 is shown on the right and the bottom housing member 110 is shown on the left. As shown in FIG. 6, the Ethernet ports 514 extend substantially perpendicularly from the circuit board assembly 508 in the direction of the central axis 106 and toward the bottom housing member 110. The circuit board assembly 508 is positioned substantially perpendicular to the central axis 106. The heat shield 510 is positioned between a portion of the circuit board assembly 508 and the bottom housing member, such that the heat shield 510 is positioned between the exterior cavity 402 of the bottom housing member 110 and the portion of the circuit board assembly 508. The heat shield 510 is not, however, positioned between the Ethernet ports 514 and the bottom housing member 110. The heat shield 510 is shaped as a partial disk (e.g., approximately 60% to approximately 75% of a circular disk) to enable the Ethernet ports 514 to be positioned adjacent to the bottom housing member 110.

The top housing member 108, at the top-end portion 204 and the rounded edges 206, has a substantially uniform thickness. For example, inner and outer surfaces of the rounded edges 206 and the top-end portion 204 follow a substantially same curve. The vertical walls 202 of the top housing member 108, however, may not include a uniform thickness. This is due to the outer surface of the vertical wall 202 having a curve while the inner surface of the vertical wall 202 has a substantially zero-draft surface (e.g., straight surface with approximately zero taper). In aspects, the zero-draft surface is substantially parallel to the central axis 106 such that an angle between the zero-draft surface and the central axis is less than approximately five degrees. This zero-draft inner surface of the vertical wall 202 enables the components within the housing to be slidably removable for easy disassembly and/or slidably insertable for easy assembly. A more detailed view of this aspect is shown in FIG. 7.

Figure 7:
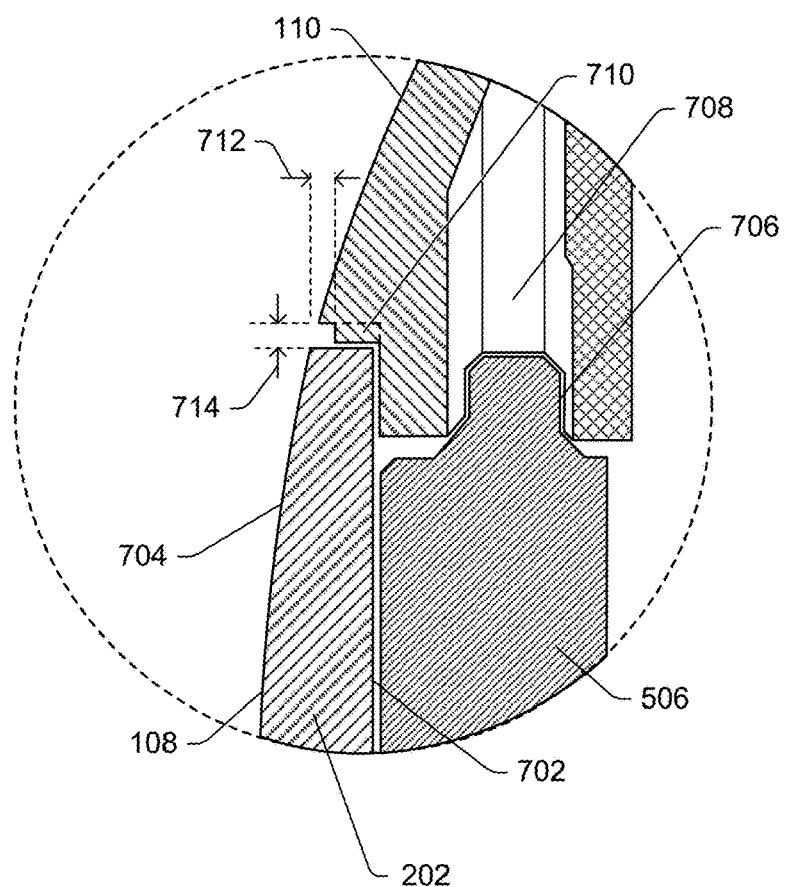
FIG. 7 illustrates an enlarged view of a portion of the rear sectional view of FIG. 5, showing a connection point between top and bottom housing members of the housing.

FIG. 7 illustrates an enlarged view 700 of a portion of the rear sectional view 500 of FIG. 5, as indicated by a dashed circle in FIG. 5 and shows a connection point between top and bottom housing members of the housing. In the enlarged view 700, the top housing member 108 is connected to the bottom housing member 110. As described above, the vertical wall 202 of the top housing member 108 includes a varying (e.g., non-uniform) thickness based on a zero-draft inner surface 702 and a curved outer surface 704. The curved outer surface 704 provides a soft-looking surface for the exterior of the access point device 102 while the zero-draft inner surface 702 enables easy insertion or removal of internal components of the access point device 102. Also shown in the enlarged view 700 is a portion of the heat sink 506, which includes a protrusion 706 positioned within a recess 708 of the bottom housing member 110 for stability.

The housing 104 includes a vertical step member 710 that interfaces the bottom housing member 110 to the top housing member 108. As illustrated, the vertical step member 710 is inset toward the central axis of the housing 104 (horizontally offset from outer surfaces of the top and bottom housing members 108, 110) by a distance x 712 that is within a range of approximately 0.25 mm to approximately 1.0 mm. The vertical step member 710 has a height y 714 that is within a range of approximately 0.2 millimeters to approximately 2.0 millimeters. The vertical step member 710 creates a horizontal gap (e.g., the seam 112 from FIG. 1) between the top housing member 108 and the bottom housing member 110, with the gap including a height equal to the height y 714 of the vertical step member 710 and a depth equal to the distance x 712 that the vertical step member 710 is inset. The resulting gap has a height variance of less than 0.5 millimeters such that the gap is substantially uniform according to user perception. Without the vertical step member 710, the connection between the top housing member 108 and the bottom housing member 110 may create a seam that is more easily perceived by the human eye as being non-uniform in height. Accordingly, the gap created by the vertical step member 710 is less likely to be perceived, by the user, as not being uniform.

Figure 8A:
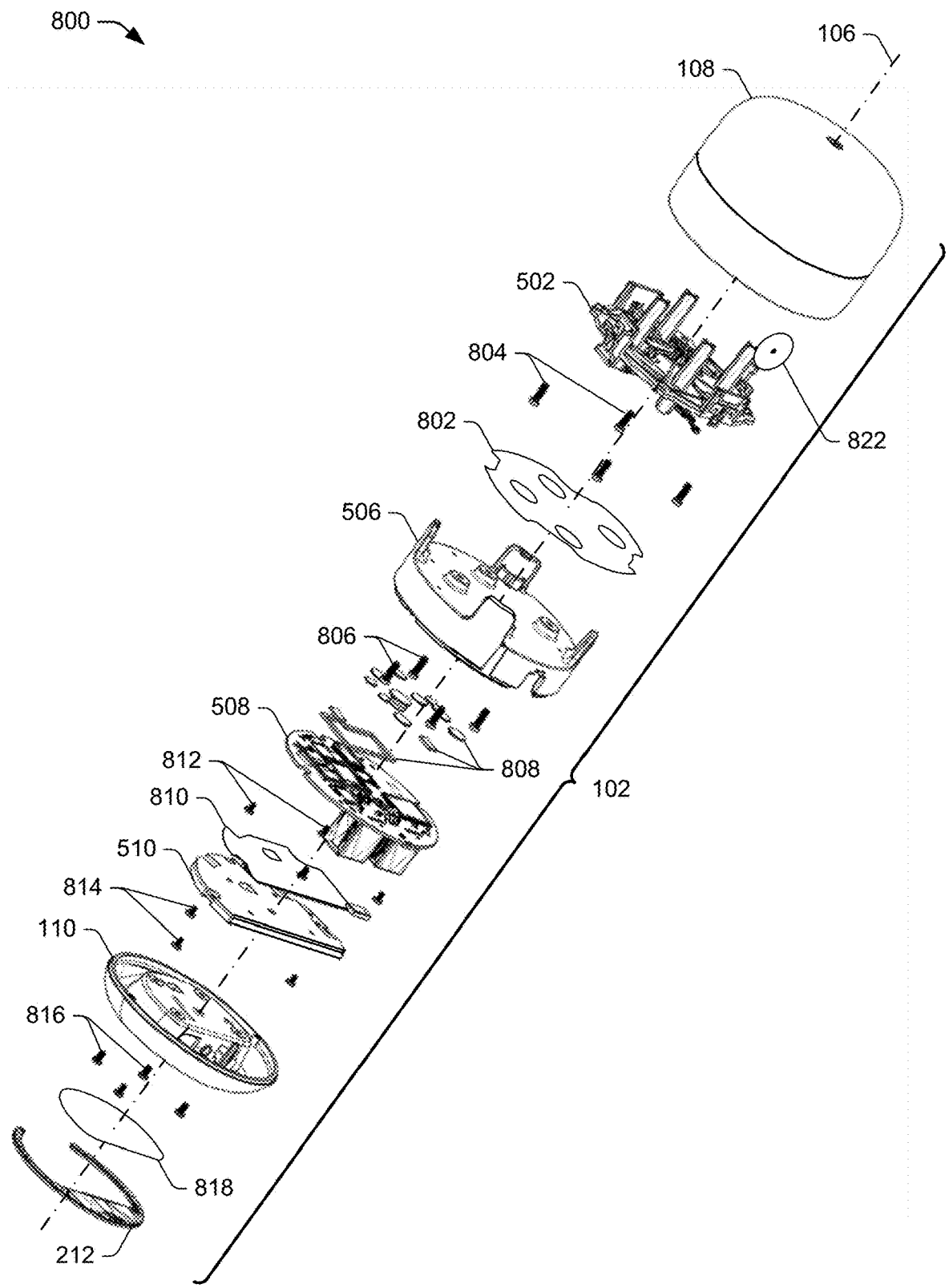
FIGS. 8A and 8B illustrate exploded views of the access point device from FIG. 1.
Figure 8B:
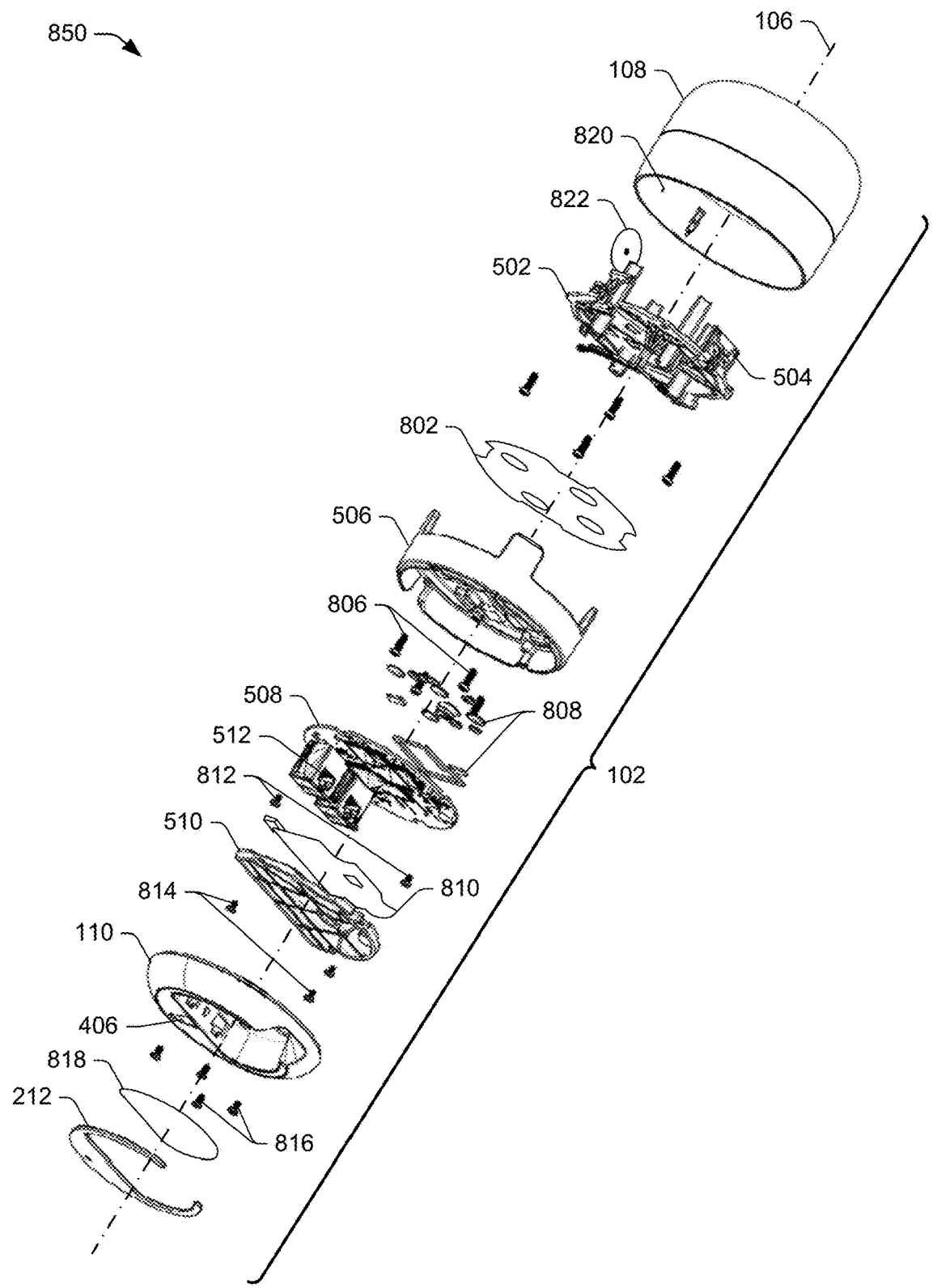

FIGS. 8A and 8B illustrate example exploded views 800 and 850, respectively, of the access point device. As generally shown in FIGS. 8A and 8B, the antenna carrier 502 is positioned between the top housing member 108 and a heat spreader 802. Fasteners 804 can be used to secure the antenna carrier 502 to the top housing member 108. Any suitable fastener may be used, such as screws, bolts, rivets, etc. The first heat spreader 802 is positioned between the antenna carrier 502 and the heat sink 506 to help spread heat across a surface of the heat sink 506. The heat sink 506 is positioned between the first heat spreader 802 and the circuit board assembly 508. Additional fasteners 806 can be used to secure the heat sink 506 to the antenna carrier 502. The first heat spreader 802 includes several holes through which protrusions on the heat sink 506 pass through to abut the antenna carrier 502. The additional fasteners 806 are positioned within holes in the protrusions and connect to the antenna carrier 502.

Thermal interface material 808 (e.g., thermal gel, thermal pads) are positioned between the heat sink 506 and the circuit board assembly 508. The circuit board assembly 508 is positioned between the heat sink 506 and a second heat spreader 810. The second heat spreader 810 abuts the heat shield 510 such that the second heat spreader 810 is positioned between the circuit board assembly 508 and the heat shield 510. The heat shield 510 abuts the bottom housing member 110. Fasteners 812 can be used to secure the circuit board assembly 508 to the heat sink 506. In addition, fasteners 814 can be used to secure the heat shield 510 to the circuit board assembly 508, or to secure the heat shield 510 to the heat sink 506 via holes in the circuit board assembly 508. Fastener 816 can be used to secure the bottom housing member 110 to the heat sink 506 via holes in the heat shield 510 and the circuit board assembly 508. The footpad 212 may be adhered to the bottom housing member 110 using any suitable adhesive. Also, a label 818 is adhered to the bottom of the bottom housing member 110, within the exterior cavity 402 shown in FIG. 4, to cover the fasteners 816 and the cantilever member 406.

The top housing member 108 also includes a recess 820 in the inner surface of the vertical wall. The top housing member 108 is translucent between the recess 820 and the outer surface of the top housing member 108. The top housing member 108 is formed of a partially translucent material (e.g., polymer or thermoplastic) such that light can pass through the material if the thickness of the material is below a threshold value. For example, a light source (e.g., light-emitting diode (LED)) connected to the circuit board assembly 508 can radiate light onto the inner surface of the top housing member 108. Based on the thickness of the top housing member 108 being below the threshold value at a location aligned with the LED, such as between the recess 820 and the outer surface of the vertical wall 202, the light passes through the top housing member 108 at that location. The light can correspond to an operating status of the access point device 102. Any suitable location on the top housing member 108 may be used to provide a status light, including a location on the top-end portion 204 of the top housing member 108. A light blocker 822 is positioned around the recess 820 to prevent the light from leaking through the top housing member 108 at locations or regions other than the intended location (e.g., the recess 820). Any suitable material can be used as the light blocker 822. One example light blocker 822 includes graphite (e.g., graphite adhesive) adhered to the top housing member 108. Another example light blocker 822 may be polyethylene terephthalate (PET) adhered to the top housing member.

Figure 9:
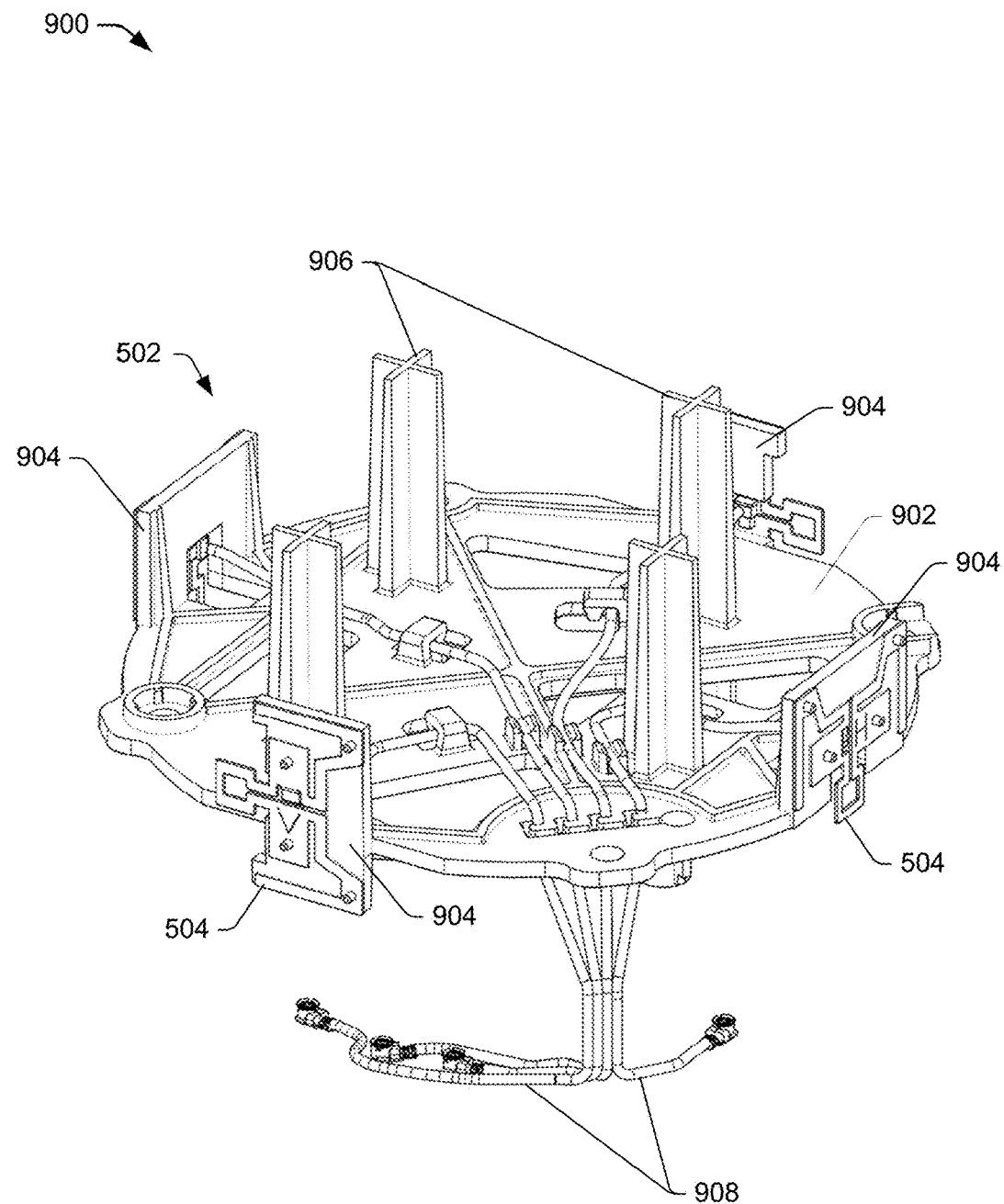
FIG. 9 illustrates a front perspective view of an example antenna carrier of the access point device.

FIG. 9 illustrates a front perspective view 900 of an antenna carrier of the access point device. The antenna carrier 502 has a generally disk-shaped body 902 having flanges 904 connected to the antennas 504. The antenna carrier 502 may be formed of any suitable non-conductive material, such as a polymer or thermoplastic. In this implementation, the antenna carrier 502 includes four flanges 904, each carrying a dipole (e.g., antenna 504) that can be implemented as a dual-band antenna. The antenna carrier 502 also includes a plurality of protrusions 906 (e.g., vertical beams) that abut the inner surface of the top-end portion 204 of the top housing member 108. The protrusions 906 define a position of the antennas 504 relative to the top-end portion 204 of the top housing member 108. Each antenna 504 includes a wired connection to the circuit board assembly 508 (shown in FIGS. 5, 6, 8A, and 8B) via a respective wire 908.

Figure 10A:
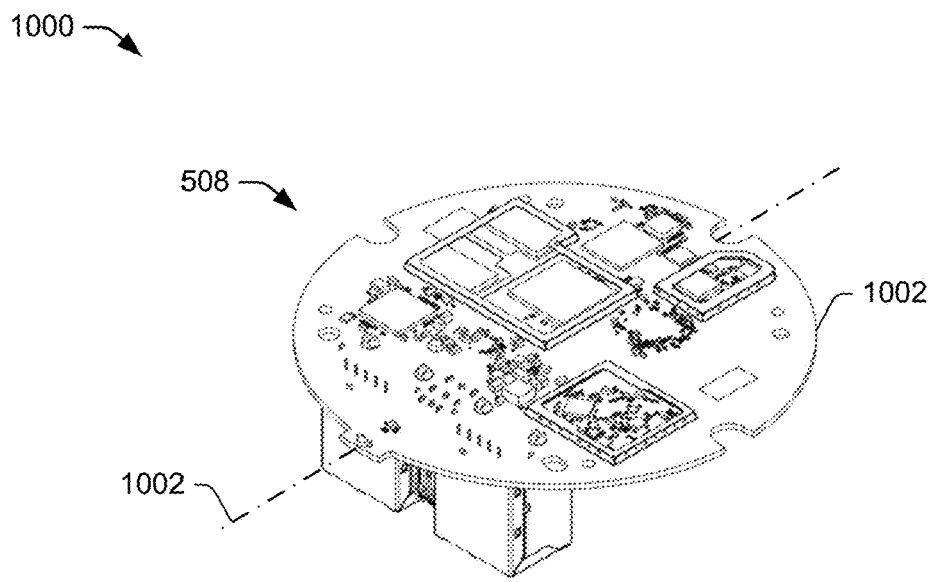
FIG. 10A illustrates a perspective view of an example circuit board assembly of the access point device.
Figure 10B:
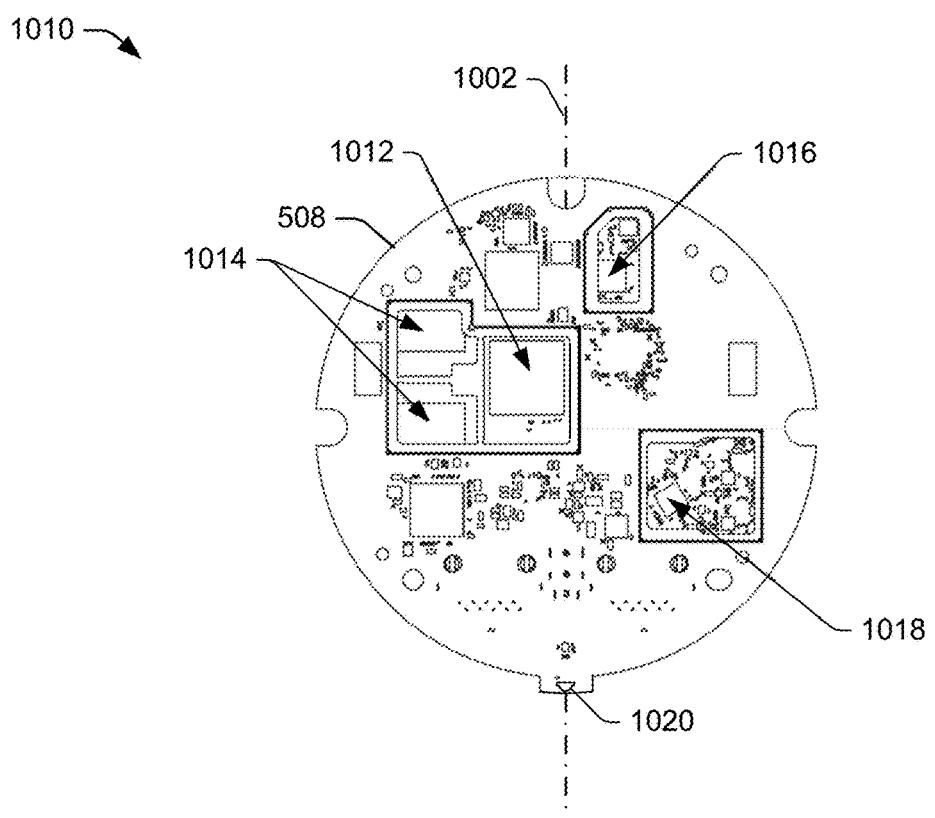
FIG. 10B illustrates a top plan view of the circuit board assembly from FIG. 10A.

FIGS. 10A to 10D illustrate various views of an example circuit board assembly. FIG. 10A illustrates a perspective view 1000 of the circuit board assembly 508 from FIGS. 5, 6, 8A, and 8B and is oriented based on an axis 1002. The axis 1002 is aligned with a plane defined by a PCB 1004 of the circuit board assembly 508. FIG. 10B illustrates a top plan view 1010 of the circuit board assembly 508 from FIG. 10A. The circuit board assembly 508 includes a system-on-chip (SoC) 1012, a memory device 1014, a thread control block 1016, a wireless network module 1018, and a light-emitting diode (LED) 1020. The memory device 1014 can include any suitable memory, such as a double data rate memory. The wireless network module 1018 can include any suitable wireless network module, such as a 2.4 GHz Wi-Fi module. The LED 1020 corresponds to an operating status of the access point device 102. In aspects, the LED 1020 is aligned with the recess 820 in the top housing member 108 to radiate light through a translucent portion of the top housing member 108 that is between the recess 820 and the outer surface of the top housing member 108.

Figure 10C:
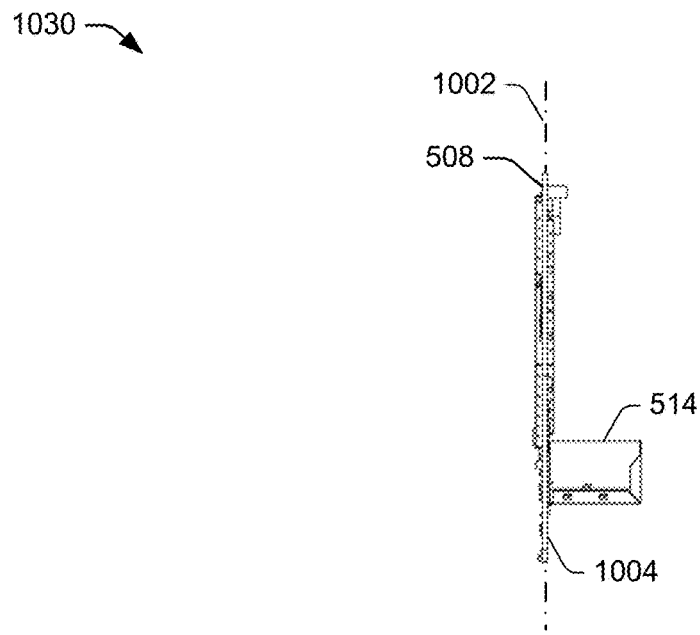
FIG. 10C illustrates a right elevational view of the circuit board assembly from FIG. 10A.
Figure 10D:
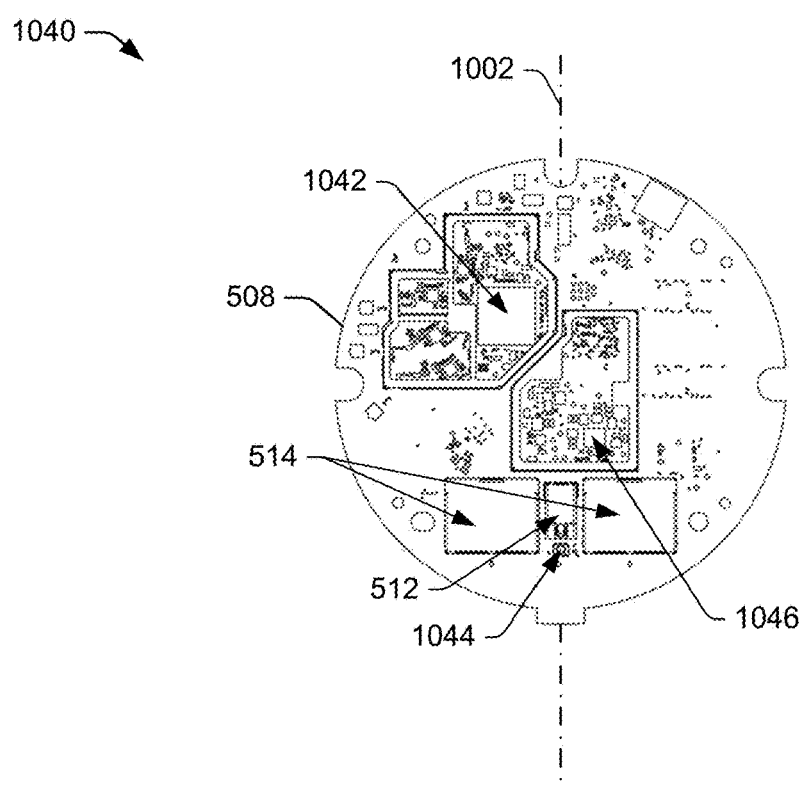
FIG. 10D illustrates a bottom side view of the circuit board assembly from FIG. 10A.

FIG. 10C illustrates a right elevational view 1030 of the circuit board assembly 508 from FIG. 10A. Here, the Ethernet port 514 is shown as extending perpendicularly from a plane defined by the PCB 1004 of the circuit board assembly 508. FIG. 10D illustrates a bottom plan view 1040 of the circuit board assembly 508 from FIG. 10A. The circuit board assembly 508 includes an additional wireless network module 1042, such as a 5 GHz Wi-Fi module. Using the wireless network module 1018 and the additional wireless network module 1042, the circuit board assembly 508 can be implemented as a dual-band router. In addition, the circuit board assembly 508 includes a tactile switch 1044 that is usable to toggle power to the electrical power connector 512. The circuit board assembly also includes a power management integrated circuit (PMIC) 1046 to control various components of the circuit board assembly 508, as well as components of the access point device 102. The arrangement of components on the circuit board assembly 508 illustrated in FIGS. 10A to 10D are shown as an example only and are not to be construed as limiting. The components of the circuit board assembly 508 can be implemented in any suitable configuration on the PCB 1004 for implementing aspects of the access point device 102.

Example Computing System

Figure 11:
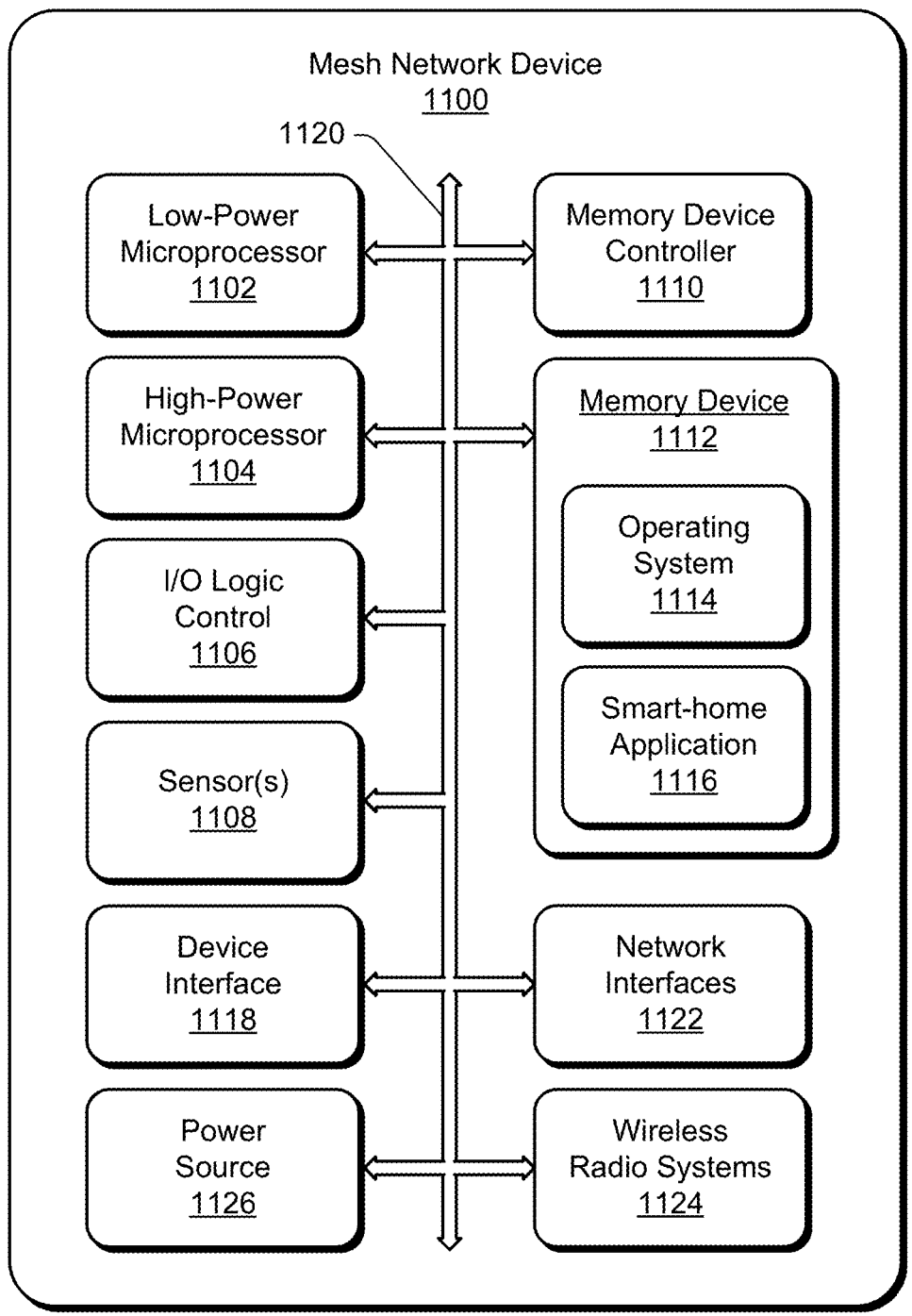
FIG. 11 is a block diagram illustrating an example mesh network device that can be implemented as any type of client, server, and/or electronic device as described with reference to FIGS. 1-10 to implement an access point device.

FIG. 11 is a block diagram illustrating an example mesh network device 1100 that can be implemented as any mesh network device in a mesh network in accordance with one or more aspects of the access point device described herein. The device 1100 can be integrated with electronic circuitry, microprocessors, memory, input output (I/O) logic control, communication interfaces and components, as well as other hardware, firmware, and/or software to implement the device in a mesh network. Further, the mesh network device 1100 can be implemented with various components, such as with any number and combination of different components as further described with reference to the example device shown in FIG. 12.

In this example, the mesh network device 1100 includes a low-power microprocessor 1102 and a high-power microprocessor 1104 (e.g., microcontrollers or digital signal processors) that process executable instructions. The device also includes an input-output (I/O) logic control 1106 (e.g., to include electronic circuitry). The microprocessors can include components of an integrated circuit, programmable logic device, a logic device formed using one or more semiconductors, and other implementations in silicon and/or hardware, such as a processor and memory system implemented as a system-on-chip (SoC). Alternatively or in addition, the device can be implemented with any one or combination of software, hardware, firmware, or fixed logic circuitry that may be implemented with processing and control circuits. The low-power microprocessor 1102 and the high-power microprocessor 1104 can also support one or more different device functionalities of the device. For example, the high-power microprocessor 1104 may execute computationally intensive operations, whereas the low-power microprocessor 1102 may manage less-complex processes such as detecting a hazard or temperature from one or more sensors 1108. The low-power processor 1102 may also wake or initialize the high-power processor 1104 for computationally intensive processes.

The one or more sensors 1108 can be implemented to detect various properties such as acceleration, temperature, humidity, water, supplied power, proximity, external motion, device motion, sound signals, ultrasound signals, light signals, fire, smoke, carbon monoxide, global-positioning-satellite (GPS) signals, radio-frequency (RF), other electromagnetic signals or fields, or the like. As such, the sensors 1108 may include any one or a combination of temperature sensors, humidity sensors, hazard-related sensors, security sensors, other environmental sensors, accelerometers, microphones, optical sensors up to and including cameras (e.g., charged coupled-device or video cameras), active or passive radiation sensors, GPS receivers, and radio-frequency identification detectors. In implementations, the mesh network device 1100 may include one or more primary sensors, as well as one or more secondary sensors, such as primary sensors that sense data central to the core operation of the device (e.g., sensing a temperature in a thermostat or sensing smoke in a smoke detector), while the secondary sensors may sense other types of data (e.g., motion, light or sound), which can be used for energy-efficiency objectives or smart-operation objectives.

The mesh network device 1100 includes a memory device controller 1110 and a memory device 1112, such as any type of a nonvolatile memory and/or other suitable electronic data storage device. The mesh network device 1100 can also include various firmware and/or software, such as an operating system 1114 that is maintained as computer executable instructions by the memory and executed by a microprocessor. The device software may also include a smart-home application 1116 that implements aspects of the access point device. The mesh network device 1100 also includes a device interface 1118 to interface with another device or peripheral component, and includes an integrated data bus 1120 that couples the various components of the mesh network device for data communication between the components. The data bus in the mesh network device may also be implemented as any one or a combination of different bus structures and/or bus architectures.

The device interface 1118 may receive input from a user and/or provide information to the user (e.g., as a user interface), and a received input can be used to determine a setting. The device interface 1118 may also include mechanical or virtual components that respond to a user input. For example, the user can mechanically move a sliding or rotatable component, or the motion along a touchpad may be detected, and such motions may correspond to a setting adjustment of the device. Physical and virtual movable user-interface components can allow the user to set a setting along a portion of an apparent continuum. The device interface 1118 may also receive inputs from any number of peripherals, such as buttons, a keypad, a switch, a microphone, and an imager (e.g., a camera device).

The mesh network device 1100 can include network interfaces 1122, such as a mesh network interface for communication with other mesh network devices in a mesh network, and an external network interface for network communication, such as via the Internet. The mesh network device 1100 also includes wireless radio systems 1124 for wireless communication with other mesh network devices via the mesh network interface and for multiple, different wireless communications systems. The wireless radio systems 1124 may include Wi-Fi, Bluetooth™, Mobile Broadband, Bluetooth Low Energy (BLE), and/or point-to-point IEEE 802.15.4. Each of the different radio systems can include a radio device, antenna, and chipset that is implemented for a particular wireless communications technology. The mesh network device 1100 also includes a power source 1126, such as a battery and/or to connect the device to line voltage. An AC power source may also be used to charge the battery of the device.

Figure 12:
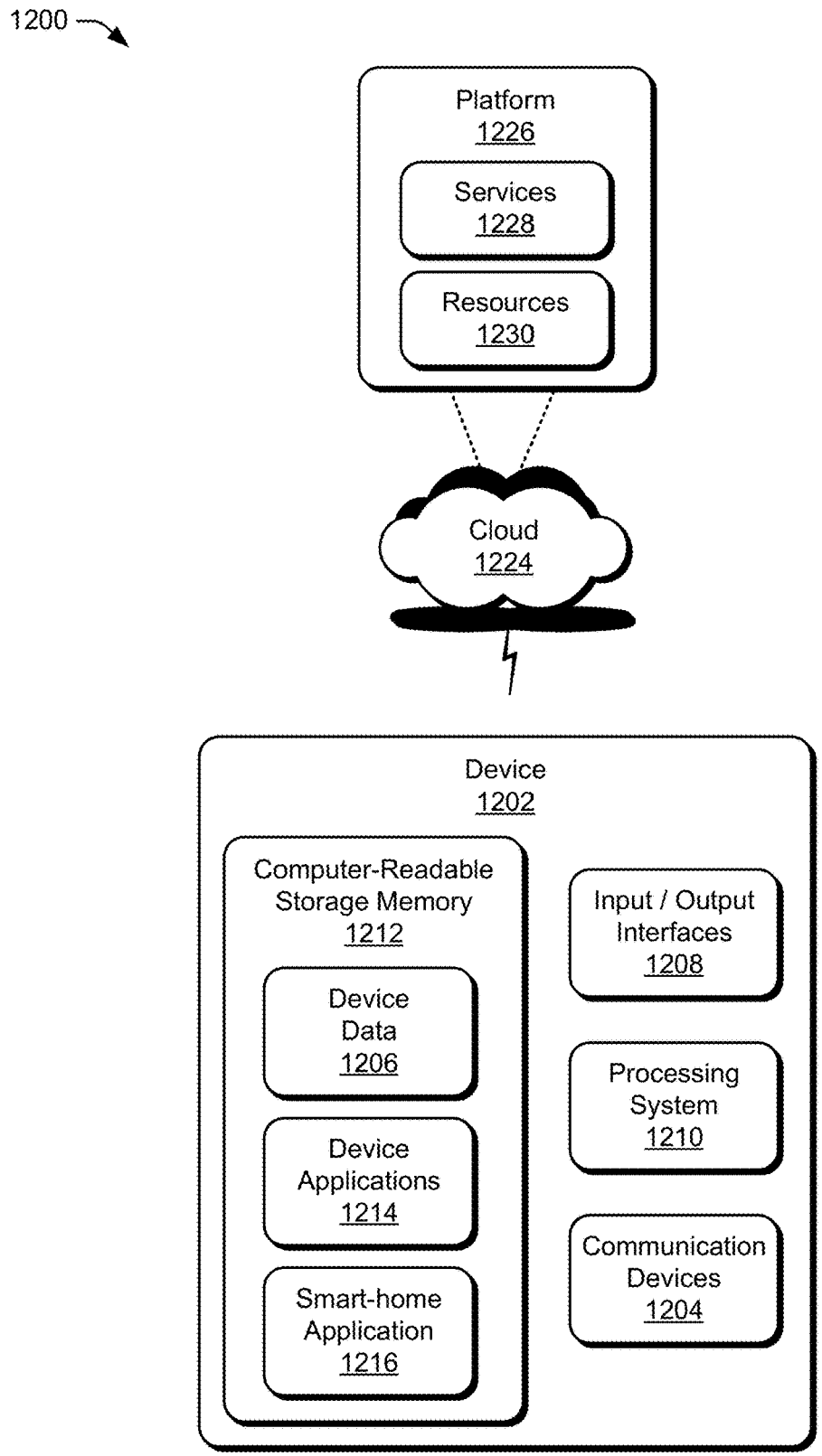
FIG. 12 is a block diagram illustrating an example system with an example device that can implement aspects of the access point device.

FIG. 12 is a block diagram illustrating an example system 1200 that includes an example device 1202, which can be implemented as any mesh network device that implements aspects of the access point device 102 as described with reference to the previous FIGS. 1-11. The example device 1202 may be any type of computing device, client device, mobile phone, tablet, communication, entertainment, gaming, media playback, and/or other type of device. Further, the example device 1202 may be implemented as any other type of mesh network device that is configured for communication on a mesh network, such as a thermostat, hazard detector, camera, light unit, commissioning device, router, border router, joiner router, joining device, end device, leader, access point, a hub, and/or other mesh network devices.

The device 1202 includes communication devices 1204 that enable wired and/or wireless communication of device data 1206, such as data that is communicated between the devices in a mesh network, data that is being received, data scheduled for broadcast, data packets of the data, data that is synched between the devices, etc. The device data can include any type of communication data, as well as audio, video, and/or image data that is generated by applications executing on the device. The communication devices 1204 can also include transceivers for cellular phone communication and/or for network data communication.

The device 1202 also includes input/output (I/O) interfaces 1208, such as data network interfaces that provide connection and/or communication links between the device, data networks (e.g., a mesh network, external network, etc.), and other devices. The I/O interfaces can be used to couple the device to any type of components, peripherals, and/or accessory devices. The I/O interfaces also include data input ports via which any type of data, media content, and/or inputs can be received, such as user inputs to the device, as well as any type of communication data, such as audio, video, and/or image data received from any content and/or data source.

The device 1202 includes a processing system 1210 that may be implemented at least partially in hardware, such as with any type of microprocessors, controllers, or the like that process executable instructions. The processing system can include components of an integrated circuit, programmable logic device, a logic device formed using one or more semiconductors, and other implementations in silicon and/or hardware, such as a processor and memory system implemented as a system-on-chip (SoC). Alternatively or in addition, the device can be implemented with any one or combination of software, hardware, firmware, or fixed logic circuitry that may be implemented with processing and control circuits. The device 1202 may further include any type of a system bus or other data and command transfer system that couples the various components within the device. A system bus can include any one or combination of different bus structures and architectures, as well as control and data lines.

The device 1202 also includes computer-readable storage memory 1212, such as data storage devices that can be accessed by a computing device, and that provide persistent storage of data and executable instructions (e.g., software applications, modules, programs, functions, or the like). The computer-readable storage memory described herein excludes propagating signals. Examples of computer-readable storage memory include volatile memory and non-volatile memory, fixed and removable media devices, and any suitable memory device or electronic data storage that maintains data for computing device access. The computer-readable storage memory can include various implementations of random access memory (RAM), read-only memory (ROM), flash memory, and other types of storage memory in various memory device configurations.

The computer-readable storage memory 1212 provides storage of the device data 1206 and various device applications 1214, such as an operating system that is maintained as a software application with the computer-readable storage memory and executed by the processing system 1210. The device applications may also include a device manager, such as any form of a control application, software application, signal processing and control module, code that is native to a particular device, a hardware abstraction layer for a particular device, and so on. In this example, the device applications also include a smart-home application 1216 that implements aspects of the access point device, such as when the example device 1202 is implemented as any of the mesh network devices described herein.

In aspects, at least part of the techniques described for the access point device may be implemented in a distributed system, such as over a "cloud" 1224 in a platform 1226. The cloud 1224 includes and/or is representative of the platform 1226 for services 1228 and/or resources 1230.

The platform 1226 abstracts underlying functionality of hardware, such as server devices (e.g., included in the services 1228) and/or software resources (e.g., included as the resources 1230), and communicatively connects the example device 1202 with other devices, servers, etc. The resources 1230 may also include applications and/or data that can be utilized while computer processing is executed on servers that are remote from the example device 1202. Additionally, the services 1228 and/or the resources 1230 may facilitate subscriber network services, such as over the Internet, a cellular network, or Wi-Fi network. The platform 1226 may also serve to abstract and scale resources to service a demand for the resources 1230 that are implemented via the platform, such as in an interconnected device embodiment with functionality distributed throughout the system 1200. For example, the functionality may be implemented in part at the example device 1202 as well as via the platform 1226 that abstracts the functionality of the cloud 1224.

Further to the descriptions above, a user (e.g., guest or host) may be provided with controls allowing the user to make an election as to both if and when systems, programs or features described herein may enable collection of user information (e.g., information about a user's social network, social actions or activities, profession, a user's preferences, or a user's current location), and if the user is sent content or communications from a server. In addition, certain data may be treated in one or more ways before it is stored or used, so that personally identifiable information is removed. For example, a user's identity may be treated so that no personally identifiable information can be determined for the user, or a user's geographic location may be generalized where location information is obtained (such as to a city, ZIP code, or state level), so that a particular location of a user cannot be determined. Thus, the user may have control over what information is collected about the user, how that information is used, and what information is provided to the user.

Some examples are described below.

Example 1. An access point comprising: a housing comprising: a top housing member having a generally cylindrical vertical wall and a top-end portion connected to a first end of the vertical wall via rounded corners, the vertical wall having a longitudinal axis, the vertical wall having an inner surface and an opposing outer surface, at least a portion of the vertical wall having non-uniform thickness in a direction of the longitudinal axis based on the outer surface of the vertical wall being curved in the direction of the longitudinal axis and the inner surface of the vertical wall being substantially parallel to the longitudinal axis, the top-end portion being concave down in a side view of the top-end portion; and a bottom housing member connected to the top housing member at a second end of the vertical wall, the bottom housing member having a bottom exterior surface and an opposing interior surface, the bottom exterior surface defining a plane that is substantially perpendicular to the longitudinal axis of the cylinder, the bottom housing member comprising a curved edge between the bottom exterior surface and the vertical wall of the top housing member; an antenna carrier supporting multiple antennas operable to transmit and receive communication signals, the antenna carrier having a substantially disk-shaped body and a plurality of flanges, one of the plurality of flanges connected to one of the multiple antennas, the antenna carrier positioned within the housing such that the multiple antennas are positioned proximate to the inner surface of the vertical wall; a circuit board assembly positioned within the housing and operable to provide a gateway to a wireless network; a heat sink positioned between the antenna carrier and the circuit board assembly within the housing; and a heat shield positioned adjacent to the circuit board assembly to shield the circuit board assembly from electromagnetic interference, the circuit board assembly positioned between the heat shield and the heat sink.

Example 2. The access point of example 1, further comprising a heat spreader positioned between the heat sink and the antenna carrier, the heat sink positioned between the heat spreader and the circuit board assembly.

Example 3. The access point of example 1, further comprising a heat spreader positioned between the circuit board assembly and the heat shield, the heat shield positioned between the circuit board assembly and the bottom housing member.

Example 4. The access point of example 1, wherein the circuit board assembly comprises one or more Ethernet ports.

Example 5. The access point of example 4, wherein: the bottom housing member includes an exterior cavity formed by a portion of the bottom exterior surface; and the exterior cavity comprises an interior side that is substantially parallel to the longitudinal axis, the exterior cavity having one or more openings aligned with the one or more Ethernet ports of the circuit board assembly.

Example 6. The access point of example 5, wherein the interior side of the exterior cavity further includes an additional opening aligned with an electrical power connector on the circuit board assembly.

Example 7. The access point of example 1, further comprising a cantilever member formed within the bottom housing member and connected to the bottom housing member at a fulcrum, wherein the cantilever member: is coplanar with the plane defined by the bottom exterior surface; and is bendable, by a force applied to a free end of the cantilever member, to interface with a reset mechanism on the circuit board assembly.

Example 8. The access point of example 1, wherein: the top housing member comprises a recess in the inner surface of the vertical wall; the vertical wall having a translucent portion between the recess and the outer surface of the vertical wall; and the access point further comprises a light source aligned with the recess to radiate light through the translucent portion of the vertical wall, the light corresponding to an operating status of the access point.

Example 9. The access point of example 8, further comprising a light blocker positioned around the recess to prevent light from passing through the vertical wall at locations other than the translucent portion.

Example 10. The access point of example 1, wherein: the housing comprises a vertical step member that interfaces the bottom housing member to the top housing member; the vertical step member is inset toward the longitudinal axis; and the vertical step member causes a gap, with a substantially uniform height, to be formed horizontally between the bottom housing member and the top housing member.

Example 11. The access point of example 1, wherein the multiple antennas include multiple dual-band antennas.

Example 12. The access point of example 1, wherein the circuit board assembly is further operable to provide a node to a wireless mesh network.

Example 13. The access point of example 1, wherein at least one of the top housing member or the bottom housing member is injection molded.

Example 14. The access point of example 1, wherein the antenna carrier comprises a non-conductive material.

Example 15. The access point of example 1, wherein the heat shield is shaped as a partial disk to enable one or more Ethernet ports on the circuit board assembly to be positioned adjacent to the bottom housing member.

Example 16. A system comprising: a housing comprising: first and second housing members sharing a common central axis and connected to one another, at least one of the first or second housing members comprising side walls having a zero-draft inner surface and a partially-curved outer surface; and rounded edges; a plurality of dual-band antennas positioned within the housing proximate to the zero-draft inner surface of the side walls; a circuit board assembly communicatively connected to the plurality of dual-band antennas to provide a gateway to a wireless network and a node to a wireless mesh network; and a heat sink positioned between the circuit board assembly and the plurality of antennas.

Example 17. The system of example 16, further comprising a heat shield positioned proximate to the circuit board assembly, the circuit board assembly positioned between the heat shield and the heat sink.

Example 18. The system of example 17, wherein the heat shield shields the circuit board assembly from electromagnetic interference from at least one of a power cable or an Ethernet cable.

Example 19. The system of example 16, wherein one of the first or second housing members comprises one or more openings aligned with one or more Ethernet ports on the circuit board assembly.

Example 20. The system of example 19, wherein: the circuit board assembly further comprises an electrical power connector positioned proximate to the one or more Ethernet ports; and the one of the first or second housing members comprises an opening through the housing, the opening aligned with the electrical power connector.

Example 21. The system of example 16, wherein: the partially-curved outer surface of the side walls is curved in a direction of the central axis; and the side walls have a varying thickness based on the zero-draft inner surface and the partially-curved outer surface.

Example 22. The system of example 16, further comprising an antenna carrier that supports the plurality of dual-band antennas, the antenna carrier comprising a non-conductive material.

Example 23. The system of example 16, wherein: the housing includes a flange that interfaces the first housing member to the second housing member; and outer surfaces of the first and second housing members are separated by a gap, having a substantially uniform height, based on the flange being horizontally offset from the outer surfaces of the first and second housing members.

Example 24. The system of example 16, further comprising a light-emitting diode (LED) connected to the circuit board assembly and positioned within the housing, wherein: a portion of one of the side walls is translucent between the partially-curved outer surface and a recess in the zero-draft inner surface of the at least one of the first or second housing members; and the LED is positioned proximate to the recess to radiate light through the translucent portion of the one of the side walls.

CONCLUSION

Although aspects of the access point device have been described in language specific to features and/or methods, the subject of the appended claims is not necessarily limited to the specific features or methods described. Rather, the specific features and methods are disclosed as example implementations of the access point device, and other equivalent features and methods are intended to be within the scope of the appended claims. Further, various different aspects are described, and it is to be appreciated that each described aspect can be implemented independently or in connection with one or more other described aspects.

What is claimed is:

1. An access point comprising:
    a housing comprising:
        a top housing member having a wall that is curved around a longitudinal axis, the top housing member having a top-end portion connected to a first end of the wall, the wall having an inner surface and an opposing outer surface; and
        a bottom housing member connected to the top housing member at a second end of the wall, the bottom housing member having a bottom exterior surface and an opposing interior surface, the bottom housing member comprising a curved edge between the bottom exterior surface and the second end of the wall of the top housing member, the bottom housing member including an exterior cavity formed by a portion of the bottom exterior surface, the exterior cavity accessible via an opening in the curved edge of the bottom housing member;
    multiple antennas positioned within the housing and operable to transmit and receive communication signals; and
    a circuit board assembly positioned within the housing and operable to provide a gateway to a wireless network, wherein the bottom housing member includes multiple additional openings located in a surface of the exterior cavity, the surface of the exterior cavity located on an opposing side of the longitudinal axis from the opening in the curved edge of the bottom housing member, the multiple additional openings including one or more first openings for receiving one or more Ethernet cables and a second opening for receiving an electrical power connector, the multiple additional openings configured to receive the one or more Ethernet cables and the electrical power connector in a direction that is perpendicular to the longitudinal axis.

2. The access point of claim 1, wherein the circuit board assembly comprises one or more Ethernet ports.

3. The access point of claim 2, wherein:
    the exterior cavity comprises an interior side that is substantially parallel to the longitudinal axis, the one or more first openings being aligned with the one or more Ethernet ports of the circuit board assembly.

4. The access point of claim 3, wherein the second opening is aligned with a power connector on the circuit board assembly.

5. The access point of claim 1, further comprising a cantilever member formed within the bottom housing member and connected to the bottom housing member at a fulcrum, wherein the cantilever member is bendable, by a force applied to a free end of the cantilever member, to interface with a reset mechanism on the circuit board assembly.

6. The access point of claim 1, wherein the multiple antennas include multiple dual-band antennas.

7. The access point of claim 1, wherein the circuit board assembly is further operable to provide a node to a wireless mesh network.

8. The access point of claim 1, wherein at least one of the top housing member or the bottom housing member is injection molded.

9. The access point of claim 1, further comprising an antenna carrier positioned within the housing a configured to support the multiple antennas, wherein:
    the antenna carrier has a substantially disk-shaped body and a plurality of flanges;
    one of the plurality of flanges is connected to one of the multiple antennas; and
    the multiple antennas are positioned proximate to the inner surface of the wall.

10. The access point of claim 9, further comprising:
    a heat sink positioned between the antenna carrier and the circuit board assembly within the housing; and
    a heat shield positioned adjacent to the circuit board assembly to shield the circuit board assembly from electromagnetic interference, the circuit board assembly positioned between the heat shield and the heat sink.

11. An access point comprising:
    a housing comprising:
        a top housing member having a wall that is curved around a longitudinal axis, the top housing member having a top-end portion connected to a first end of the wall, the wall having an inner surface and an opposing outer surface, the top housing member having a recess in the inner surface of the wall, the wall having a translucent portion between the recess and the outer surface of the wall; and a bottom housing member connected to the top housing member at a second end of the wall, the bottom housing member having a bottom exterior surface and an opposing interior surface, the bottom housing member comprising a curved edge between the bottom exterior surface and the second end of the wall of the top housing member;

a light source aligned with the recess to radiate light through the translucent portion of the wall, the light corresponding to an operating status of the access point;

multiple antennas positioned within the housing and operable to transmit and receive communication signals; and a circuit board assembly positioned within the housing and operable to provide a gateway to a wireless network.

12. The access point of claim 11, further comprising a light blocker positioned around the recess to prevent light from passing through the wall at locations other than the translucent portion.

13. The access point of claim 11, wherein the bottom housing member includes an exterior cavity that is formed by a portion of the bottom exterior surface and that is accessible via an opening in the curved edge of the bottom housing member.

14. The access point of claim 13, wherein:
the exterior cavity includes a surface located on an opposing side of the longitudinal axis from the opening in the curved edge of the bottom housing member; and
the surface has multiple additional openings including one or more first openings for receiving one or more Ethernet cables and a second opening for receiving an electrical power connector.

15. The access point of claim 14, wherein:
the one or more first openings are aligned with one or more Ethernet ports on the circuit board assembly; and
the second opening is aligned with a power connector on the circuit board assembly.

16. An access point comprising:
a housing comprising:
a top housing member having a wall that is curved around a longitudinal axis, the top housing member having a top-end portion connected to a first end of the wall, the wall having an inner surface and an opposing outer surface;
a bottom housing member connected to the top housing member at a second end of the wall, the bottom housing member having a bottom exterior surface and an opposing interior surface, the bottom housing member comprising a curved edge between the bottom exterior surface and the second end of the wall of the top housing member; and
a step member that:
interfaces the bottom housing member to the top housing member;
is inset toward the longitudinal axis; and
causes a gap, with a substantially uniform height, to be formed between the bottom housing member and the second end of the top housing member;
multiple antennas positioned within the housing and operable to transmit and receive communication signals; and
a circuit board assembly positioned within the housing and operable to provide a gateway to a wireless network.

17. The access point of claim 16, wherein:
the substantially uniform height of the gap is within a range of 0.2 millimeters to 2.0 millimeters;
the step member is inset from the outer surface of the wall of the top housing member by a distance that is within a range of 0.25 millimeters to 1.0 millimeter; and
the gap has a height variance of less than 0.5 millimeters.

18. The access point of claim 16, wherein the bottom housing member is shorter than the top housing member such that the gap is located on a lower half of the housing.

19. The access point of claim 16, wherein the bottom housing member includes an exterior cavity that is formed by a portion of the bottom exterior surface and that is accessible via an opening in the curved edge of the bottom housing member.

20. The access point of claim 19, wherein:
the exterior cavity includes a surface located on an opposing side of the longitudinal axis from the opening in the curved edge of the bottom housing member; and
the surface has multiple additional openings including one or more first openings for receiving one or more Ethernet cables and a second opening for receiving an electrical power connector.

* * * * *